(12) United States Patent
Chan

(10) Patent No.: US 8,247,254 B2
(45) Date of Patent: Aug. 21, 2012

(54) SYSTEM AND METHOD FOR FORMING SOLAR CELL STRUCTURES

(75) Inventor: Chung Chan, Hong Kong (CN)

(73) Assignee: Silicon China (HK) Ltd., Kowloon (HK)

(*) Notice: Subject to any disclaimer, the term of this patent is extended or adjusted under 35 U.S.C. 154(b) by 236 days.

(21) Appl. No.: 12/170,423

(22) Filed: Jul. 9, 2008

(65) Prior Publication Data

US 2009/0014069 A1 Jan. 15, 2009

Related U.S. Application Data

(60) Provisional application No. 60/949,828, filed on Jul. 13, 2007.

(51) Int. Cl.
*H01L 31/10* (2006.01)
*H01L 31/0264* (2006.01)
*H01L 31/04* (2006.01)

(52) U.S. Cl. ......... 438/57; 136/252; 136/255; 136/256; 136/258; 438/72; 438/73; 438/96; 438/97; 438/98

(58) Field of Classification Search .......... 136/252, 136/255, 258, 259; 438/57, 72, 73, 96–98
See application file for complete search history.

(56) References Cited

U.S. PATENT DOCUMENTS 5,057,163 A * 10/1991 Barnett et al. ............ 136/258
5,147,468 A * 9/1992 Deguchi ..................... 136/244
2004/0112426 A1 * 6/2004 Hagino ....................... 136/261
2005/0161078 A1 * 7/2005 Aiken ......................... 136/259
2006/0255340 A1 * 11/2006 Manivannan et al. ......... 257/79

OTHER PUBLICATIONS

Landis Geoffrey A., "A Light-Trapping Solar Cell Coverglass," IEEE Photovoltaic Specialists Conference, Kissimmee, FL, May 21-25, 1990, vol. 2, pp. 1304-1307.
International Search Report and Written Opinion of PCT Application No. PCT/US2008/069684, date of mailing Sep. 25, 2008, 11 pages total.

* cited by examiner

*Primary Examiner* — Jennifer Michener
*Assistant Examiner* — Matthew Martin
(74) *Attorney, Agent, or Firm* — Ella Cheong Hong Kong; Margaret A. Burke; Sam T. Yip

(57) ABSTRACT

System and method for forming solar cell structures using a foundry compatible process. According to an embodiment, the present invention provides a method for manufacturing a solar cell. The method includes providing a substrate. The substrate includes a support region. The method also includes transferring a photovoltaic material overlying the support region of the substrate. The photovoltaic material is characterized by a first thickness. The method further includes forming an emitter region on the photovoltaic material by a diffusion process. The emitter region is characterized by a first impurity type. In addition, the method includes forming a mask overlaying the emitter region. The mask exposes at least a first contact region. The method also includes forming the first contact region within the first thickness of the photovoltaic material. Furthermore, the method includes doping the first contact region with a second impurity type.

37 Claims, 8 Drawing Sheets

SYSTEM AND METHOD FOR FORMING SOLAR CELL STRUCTURES

CROSS-REFERENCES TO RELATED APPLICATIONS

This Application claims priority to Provisional Patent Application No. 60/949,828, filed Jul. 13, 2007, which is herein incorporated by reference for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to solar energy techniques. In particular, the present invention provides a method and resulting device fabricated for solar cell structures with high efficiency and low material costs. More particularly, the present invention provides a method and resulting device for manufacturing solar cells with thin photovoltaic regions and electrical contacts coupled to the photovoltaic regions. In a particular example, electrical contacts are manufactured to position on the same side of a solar cell. Merely by way of example, the invention has been applied to solar cells and solar panels, commonly termed modules, but it would be recognized that the invention has a much broader range of applicability.

Consumption of energy resources continues to grow, as the population of the world increases rapidly to over six billion people. Often times, conventional energy comes from fossil fuels, including oil and coal, hydroelectric plants, nuclear sources, and others. As merely an example, further increases in oil consumption have been projected. Developing nations such as China and India account for most of the increase, although the United States remains the biggest consumer of energy resources. In the U.S., almost every aspect of our daily lives depends, in part, on oil. These aspects include driving to and from work, heating our homes, and operating large machines for construction and the like.

Oil is becoming increasingly scarce. As time further progresses, an era of "cheap" and plentiful oil is coming to an end. Oil will eventually disappear, which could possibly take us back to primitive times. Accordingly, other and alternative sources of energy have been developed. Modern day society has also relied upon other very useful sources of energy. Such other sources of energy include hydroelectric, nuclear, and the like to provide our electricity needs. Such electricity needs range from lighting our buildings and homes to operating computer systems and other equipment and the like. Most of our conventional electricity requirements for these home and business use come from turbines run on coal or other forms of fossil fuel, nuclear power generation plants, and hydroelectric plants, as well as other forms of renewable energy. A popular form of renewable energy has been solar, which is derived from our sun.

The sun is essential for solar energy. Solar energy possesses many desired characteristics. As noted above, solar energy is renewable. Solar energy is also abundant and clean. Conventional technologies developed often capture solar energy, concentrate it, store it, and convert it into other useful forms of energy. A popular example of one of these technologies includes solar panels. Such solar panels include solar cells that are often made using silicon bearing materials, such as polysilicon or single crystal silicon. An example of such solar cells can be manufactured by various companies that span our globe. Such companies include, among others, Q Cells in Germany, Sun Power Corporation in California, Suntech of China, and Sharp in Japan. Other companies include BP Solar and others.

Unfortunately, solar cells still have limitations although solar panels have been used successfully for certain applications. As an example, solar cells are often costly. Solar cells are often composed of silicon bearing wafer materials, which are difficult to manufacture efficiently on a large scale. Availability of solar cells made of silicon is also somewhat scarce with limited silicon manufacturing capacities. These and other limitations are described throughout the present specification, and may be described in more detail below.

From the above, it is seen that techniques for improving solar devices is highly desirable.

BRIEF SUMMARY OF THE INVENTION

The present invention relates generally to solar energy techniques. In particular, the present invention provides a method and resulting device fabricated for solar cell structures with high efficiency and low material costs. More particularly, the present invention provides a method and resulting device for manufacturing solar cells with thin photovoltaic regions and electrical contacts coupled to the photovoltaic regions. In a particular example, electrical contacts are manufactured to position on the same side of a solar cell. Merely by way of example, the invention has been applied to solar cells and solar panels, commonly termed modules, but it would be recognized that the invention has a much broader range of applicability.

According to an embodiment, the present invention provides a method for manufacturing a solar cell. The method includes providing a substrate. For example, the substrate includes a support region. The method also includes transferring a photovoltaic material overlying the support region of the substrate. The photovoltaic material is characterized by a first thickness. The method further includes forming an emitter region on the photovoltaic material by at least a diffusion process. The emitter region is characterized by a first impurity type. In addition, the method includes forming a mask overlaying the emitter region. The mask exposes at least a first contact region. The method also includes forming the first contact region within the first thickness of the photovoltaic material. Furthermore, the method includes doping the first contact region with a second impurity type. The second impurity type and the first impurity type are characterized by opposite polarities. Moreover, the method includes removing the mask. The method additionally includes forming a passivation overlaying the first contact region and the photovoltaic. Also, the method includes forming an anti-reflection coating overlaying the passivation. The method further includes forming a pattern using the anti-reflection region for a first opening and a second opening. The first opening is positioned within a vicinity of the first contact region and exposes the first contact region. The second opening is positioned outside the first contact region and exposing the emitter region. The first opening and the second opening face a substantially similar direction. Furthermore, the method includes sputtering metal material to form a first metal contact and a second metal. The first metal contact is electrically coupled to the first contact region. The second metal contact is electrically coupled to the emitter region.

According to yet another embodiment, the present invention provides a partially processed semiconductor substrate for manufacturing a solar cell. The substrate includes a support layer. The support layer is characterized by a thickness of at least 150 microns. The substrate also includes a transferring layer overlaying the support layer. The substrate further includes a photovoltaic material overlaying the transferring layer. The photovoltaic material is characterized by a thickness of less than fifteen microns. The photovoltaic material includes a top region and a bottom region. The top region is characterized by a first impurity type. The bottom side is characterized by a second impurity type. The first impurity type and the second impurity type have opposite polarities. The photovoltaic material includes a first opening, which exposes the bottom region. The substrate further includes a passivation overlaying the photovoltaic material. The passivation includes a second opening exposing the top region. The substrate additionally includes an anti-reflection region overlaying the passivation. The anti-reflection region includes a third opening exposing the top region. The substrate further include a first metal contact that has a first portion and a second portion. The first portion is electrically coupled to the bottom region. The second portion partially overlays the anti-reflection region. Moreover, the substrate includes a second metal contact including a third portion and a fourth portion. The third portion is electrically coupled to the top region. The fourth portion partially overlays the anti-reflection region.

According to yet another embodiment, the present invention provides a method for manufacturing a solar cell. The method includes providing a partially processed semiconductor substrate. The substrate includes at least a support layer and a photovoltaic material. The support layer is characterized by a thickness of at least 150 microns. The photovoltaic material overlays the support layer. The photovoltaic material is characterized by a thickness of less than fifteen microns. The photovoltaic material includes a top region and a bottom region. The top region is characterized by a first polarity. The bottom side is characterized by a second polarity. The first polarity is opposite from the second polarity. The method also includes forming a mask overlaying the top side. The mask exposes at least a first contact region. The method also includes forming a first contact opening partially exposing the bottom side. Furthermore, the method includes removing the mask. In addition, the method includes forming a passivation overlaying the top region. The method further includes forming an anti-reflection coating overlaying the passivation. Moreover, the method includes defining a pattern using the anti-reflection region for the first opening and a second opening. The second opening is positioned outside the first contact region and exposing a portion of the top region. The method additionally includes sputtering metal material to form a first metal contact and a second metal contact using a sputtering process. The first metal contact is electrically coupled to the top region. The second metal contact is electrically coupled to the bottom region. The first metal contact and the second metal contact are positioned on a same side.

Many benefits are achieved by way of the present invention over conventional techniques. For example, the present technique provides an easy to use process that relies upon conventional technology such as silicon materials, although other materials can also be used. Additionally, the method provides a process that is compatible with conventional process technology without substantial modifications to conventional equipment and processes. Preferably, the invention provides for an improved solar cell, which is less costly and easy to handle. Such solar cell uses a foundry compatible process for manufacture at one of multiple semiconductor foundry operations according to a specific embodiment. In a preferred embodiment, the present method and structure can be implemented using conventional semiconductor processing technology. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to solar energy techniques. In particular, the present invention provides a method and resulting device fabricated for solar cell structures with high efficiency and low material costs. More particularly, the present invention provides a method and resulting device for manufacturing solar cells with thin photovoltaic regions and electrical contacts coupled to the photovoltaic regions. In a particular example, electrical contacts are manufactured to position on the same side of a solar cell. Merely by way of example, the invention has been applied to solar cells and solar panels, commonly termed modules, but it would be recognized that the invention has a much broader range of applicability.

As explained above, the lack of silicon material has been a challenge in manufacturing solar panels on large scale. Over the past, various conventional techniques have been developed to produce cost-efficient solar panels. Unfortunately, conventional techniques are often inadequate in various ways. More specifically, conventional techniques often involve reducing the amount of silicon material used for manufacturing solar panels. However, solar panels that are manufactured with reduced amounts of silicon materials often fail to meet performance goals (e.g., being able to produce a desired amount of energy per unit area).

In a related application U.S. Provisional Application, 60/864,936 filed 8 Nov. 2006, which is herein incorporated by reference for all purposes, a method for manufacturing solar cells with thin photovoltaic material layer is described. As described in this related application, photovoltaic layer is manufactured with a thickness of less than 20 microns. In certain embodiments of the method described in the related application, the photovoltaic layer has a thickness ranges from 1 to 10 microns. In comparison, conventional state-of-the-art techniques typically manufacture photovoltaic layers with a thickness of over 100 microns.

To be able to fully and efficiently utilize solar cells with such thin photovoltaic layers, the present invention provides a system and method for manufacturing solar cell structures.

Figure 1:
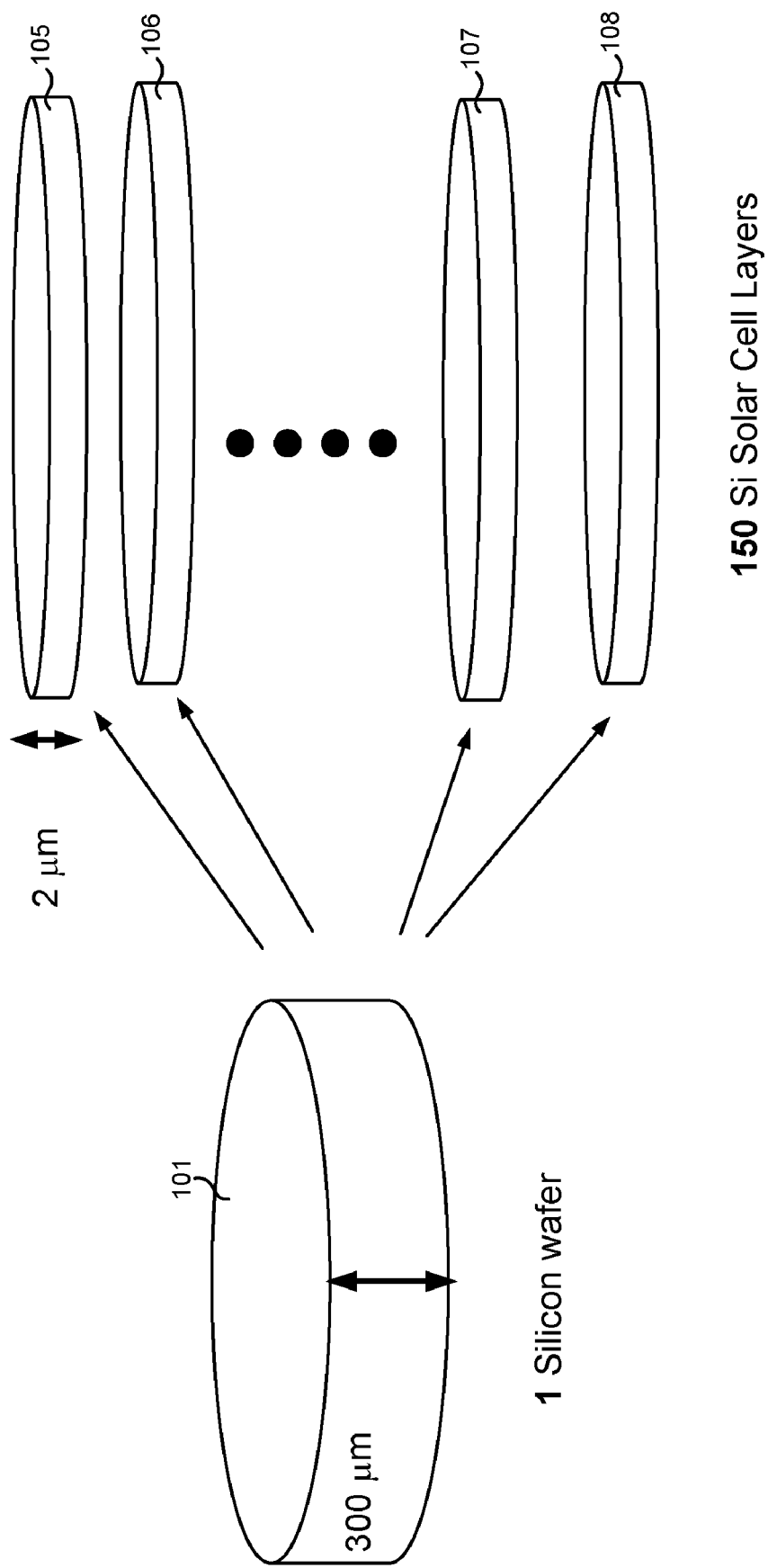
FIG. 1 is a simplified diagram of a plurality of silicon slices from a single crystal substrate member.

FIG. 1 is a simplified diagram of a plurality of silicon slices from a single crystal substrate member. This diagram is merely an example, which should not unduly limit the scope of the claims herein. One of ordinary skill in the art would recognize other variations, modifications, and alternatives. As shown, a photovoltaic material wafer is divided into two-micron thick silicon layer. Thin slices of silicon layers (e.g., layers 105, 106, 107, 108) are formed from a relative thick silicon wafer 101. As an example, the silicon wafer 101 has a thickness of approximately three hundred microns, which is about the thickness of the silicon layer for a conventional solar cell. In an exemplary embodiment, the silicon wafer 101 has a thickness of three hundred microns and sliced into approximately one hundred and fifty thin slices of silicon layers. In alternative embodiments, the present method and system can use other materials such as silicon germanium, gallium arsenide and other Group III/V materials, or Group II/VI materials. Depending upon the embodiment, the material can be single crystal, polysilicon, or amorphous. Alternatively, the material can be graded, homogeneous, layered, or any combination of these. Of course, there can be other variations, modifications, and alternatives.

Figure 2:
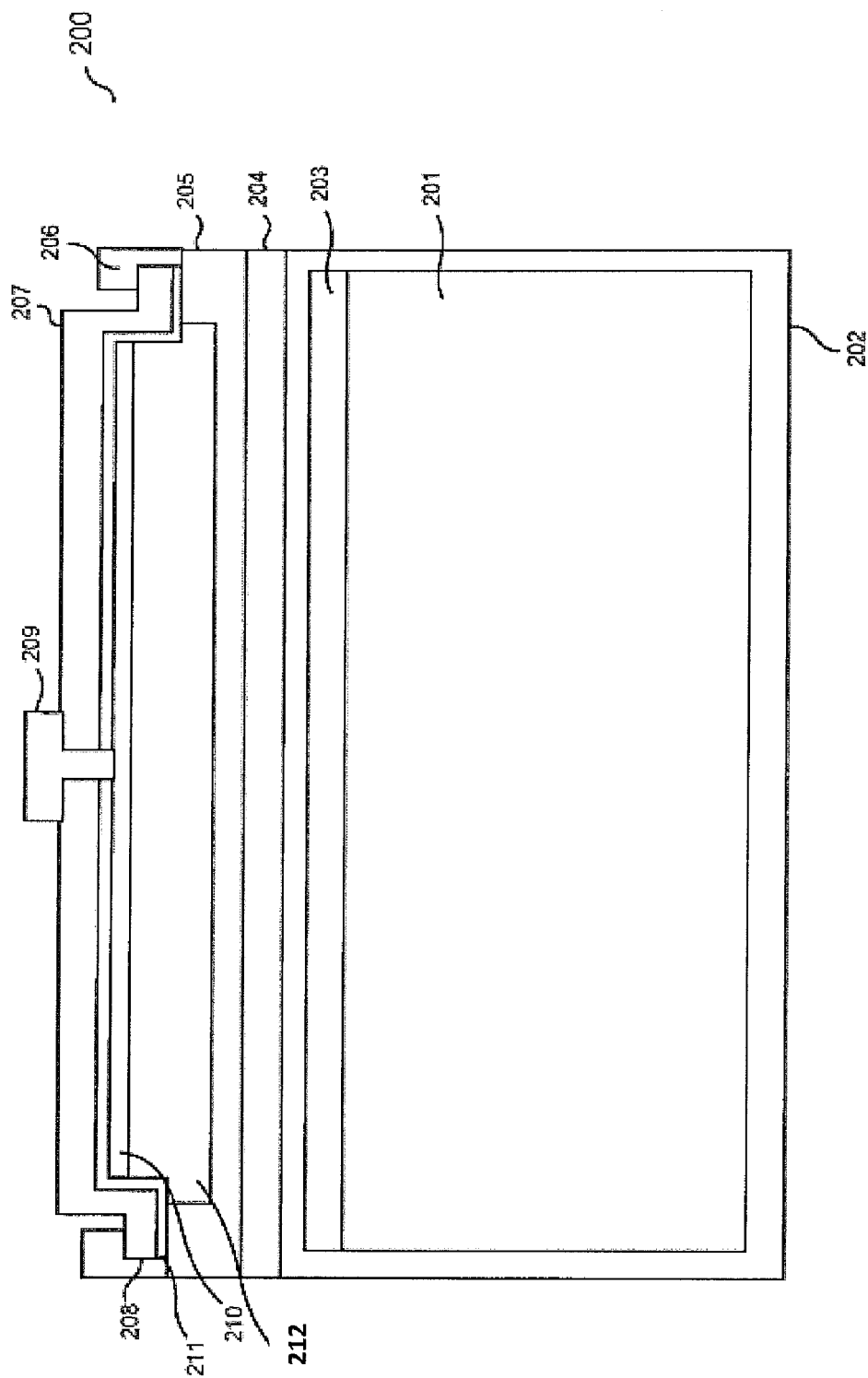
FIG. 2 is a simplified diagram illustrating a solar cell structure according to an embodiment of the present invention.

FIG. 2 is a simplified diagram illustrating a solar cell structure according to an embodiment of the present invention. This diagram is merely an example, which should not unduly limit the scope of the claims. One of ordinary skill in the art would recognize many variations, alternatives, and modifications. As shown in the simplified diagram of FIG. 2, a solar cell 200 includes the following components in a specific embodiment:

1. a supporting layer 201;
2. a diffusion barrier layer 202;
3. a mirror 203;
4. an adhesive layer 204;
5. a contact region 205;
6. metal contacts 206, 208, and 209;
7. a passivation region 211;
8. an emitter region 210;
9. a photovoltaic region 212; and
10. an anti-reflection coating (ARC) 207.

As shown, each of these elements is provided for illustrative purposes only. There can be other variations, modifications, and alternatives. Additionally, as used herein the above terms should be construed in terms of the present specification and also according to plain meaning by one of ordinary skill in the art. As an example, the supporting layer 201 is implemented to enhance the rigidity and integrity of the solar cell 200. Considering that the thickness of the photovoltaic region 212 is less than twenty microns, the supporting layer 201 is often necessary to allow the solar cell 200 be useful in various applications. For example, without the supporting layer 201, the solar cell 200 may be shattered and/or subject to damage or other undesirable influences. Further details of the support layer (which can also be a member, substrate, or other entity) can be found throughout the present specification and more particularly below.

In a specific embodiment, the supporting layer consists essentially of metallurgical grade polysilicon material, although other slight variations in material can be used in other embodiments. As merely an example, metallurgical grade polysilicon material is made of polysilicon having impurities therein. Such impurities can include metal material and others according to a specific embodiment. The metallurgical grade polysilicon cannot generally be used for manufacture of integrated circuits, display devices, or photovoltaic devices based upon at least certain impurity levels. However, it is to be understood that the supporting layer may include still other types of materials as well. In an exemplary embodiment, the thickness of the supporting layer made of metallurgical polysilicon ranges from 250 to 300 microns. Depending on the specific application, the thickness of the supporting layer may be changed. For example, for extra rigidity and reliability, the thickness of the supporting layer 201 may be much greater. As another example, to reduce the bulk and weight of the solar cell, the thickness of the supporting layer 201 may be reduced to, for example, approximately 150 microns. Of course, there can be other variations, modifications, and alternatives.

In another specific embodiment, the supporting layer consists essentially of ceramic material. As merely an example, the ceramic material is made of sintered ceramic powders bonded with adhesives. In an exemplary embodiment, the thickness of the supporting layer made of ceramic ranges from 250 to 300 microns. Depending on the specific application, the thickness of the supporting layer may be changed. For example, for extra rigidity and reliability, the thickness of the supporting layer 201 may be much greater. As another example, to reduce the bulk and weight of the solar cell, the thickness of the supporting layer 201 may be reduced to, for example, approximately 150 microns. Of course, there can be other variations, modifications, and alternatives.

In a preferred embodiment, the supporting layer is enclosed using one or more barrier materials. The supporting layer 201 is enclosed by the diffusion barrier layer 202 according to a specific embodiment. Among other things, the diffusion barrier layer 202 is used to prevent undesired diffusion of charges from the photovoltaic region 212, which could lower the performance of the solar cell 200. Alternatively, the diffusion barrier prevents any impurities from migrating from the supporting layer to active devices on one or more photovoltaic regions. In a specific embodiment, the diffusion barrier layer 202 consists essentially of silicon nitride material. Alternatively, the diffusion barrier layer can include silicon nitride material or combinations of other materials and also be substituted with still other materials, such as silicon nitride, titanium nitride, etc. Of course, there can be other variations, modifications, and alternatives. As an example, the silicon nitride material is deposited over the supporting layer 201 using a chemical deposition process, such as a plasma-enhanced chemical vapor deposition (PECVD) process. In an exemplary embodiment, the thickness of the diffusion barrier layer 202 is approximately one to three microns. Within the spirit of the present invention, the thickness of the diffusion barrier layer 202 may be thicker or thinner. In a specific embodiment, the silicon nitride provides a barrier between the support layer and one or more photovoltaic regions. Further details of the present device and methods of manufacture can be found throughout the present specification and more particularly below.

In certain embodiments, the mirror 203 as shown is positioned within the barrier layer 202 and overlays the supporting layer 201. Depending on the application, the mirror 203 may be placed in other positions as well. For example, the mirror 203 may be placed between the contact region 205 and the transferring region 204. According to various embodiments, the mirror 203 is placed beneath the photovoltaic region 212 to enhance efficiency for the solar cell 200. Among other things, the mirror 203 prevents photon from passing through the photovoltaic region 212 and pass to the supporting layer 201. With the mirror 203, the photons that passes through the photovoltaic region 212 is reflected back to the photovoltaic region 212 to allow the energy that is carried by the photon to be captured by the solar cell 200. According to an embodiment, the mirror 203 consists of refractory or noble metal material and salicide. For example, the mirror material is silver, silver alloys, titanium nitride, etc. In a specific embodiment, mirror 203 is formed via a deposition process with a thickness of 0.1 to 0.3 micron.

The adhesive layer 204 is provided for coupling the photovoltaic region 212 and the supporting layer 201 together. In a specific embodiment, the adhesive layer is first coupled to the supporting layer 201 and then coupled to the photovoltaic region 212. According to certain embodiments, the adhesive layer 204 consists of spin-on-glass. Other adhesive mixtures can also be used. During the coupling process, the adhesive layer 204 is heated to a high temperature in order for coupling. Typically, the adhesive layer is characterized by a thickness of approximately one to three microns. In certain application, a thicker adhesive layer 204 may be used to provide addition support and coupling strength.

The photovoltaic region 212, among other things, is characterized by a thickness of less than 20 microns. As described in the related application, the thin photovoltaic region 212 may be formed by way of a hydrogenation process. According to an embodiment, the photovoltaic region 212 consists essentially of single crystal silicon. In a specific embodiment, the photovoltaic region 212 is slightly doped with boron. There might be other types of doping as well depending on the application. In an exemplary embodiment, the photovoltaic region 212 is transferred from a surface portion of a single crystal silicon substrate. The method includes a step for providing a single crystal silicon substrate that has a surface region. The method also includes a step for performing a first implantation process to introduce a first impurity species through the surface region and within a vicinity of a first thickness of the surface region. The method additionally includes a step for performing a second implantation process to introduce a plurality of hydrogen species at a region underlying the surface region and to define a thickness of single crystal silicon to be removed. In addition, the method includes a step for bonding the surface region of the single crystal silicon substrate to a stiffener member to form a multi-layered structure including a reflector region at an interface between the surface region and the stiffener member. Also, the method includes a step for performing a thermal treatment process on the multi-layered structure to cause separation at the region underlying the surface region of the single crystal silicon substrate and to exfoliate the thickness of single crystal silicon material, while the thickness of single crystal material remains attached to the stiffener member, to form a roughened region defining the thickness of single crystal silicon material. In addition, the method includes a step for forming one or more photovoltaic devices onto the thickness of the single crystal silicon material.

The contact region 205 is formed within a portion of the photovoltaic region 212. For example, the contact region 205 consists essentially of single crystal silicon material. In a specific embodiment, the contact region 205 is formed by doping a thickness of the photovoltaic region 212 with various types of polar material. For example, the contact region 205 is doped with p+ type material. In a specific embodiment, the contact region 205 is formed by diffusing boron into the photovoltaic region 212. For example, double boron implantation process is used to dope the contact region 205. In a preferred embodiment, the contact region 205 has a thickness of approximately 0.2 micron. In certain applications, the contact region 205 may have a greater thickness for better electrical contact performance.

The emitter region 210 is positioned over the photovoltaic region 212. The emitter region 210 is characterized by a polarity that is opposite from the polarity of the contact region 205. In a specific embodiment, the emitter region 210 is characterized by an n+ polarity wherein the contact region 205 is characterized by a p+ polarity. For example, the emitter region 210 is formed by diffusion n+ material into a thickness of the photovoltaic region 212. For example, the emitter region 210 is formed by a diffusion process where the photovoltaic region 212 is subjected to $POCl_3$ at 900 degrees Celsius for 30 minutes. In an alternative embodiment, the emitter region 210 is characterized by an p+ polarity wherein the contact region 205 is characterized by a n+ polarity. For example, the emitter region 210 is formed by diffusion p+ material into a thickness of the photovoltaic region 212. Typically, the thickness of the emitter region 210 is approximately 0.2 micron, which is similar to the thickness of the contact region 205. In certain applications, the emitter region 210 may have a greater thickness for better electrical contact performance.

The passivation region 211 overlays both the emitter region 210 and the exposed portion of the contact region 205. Depending on the application, the passivation region 211 may include oxide, nitride, and/or other types of materials. In certain applications, the passivation region 211 is used for providing insulation. In a specific embodiment, the passivation region 211 is formed by way of implanting active $O_2$. In an alternative embodiment, the passivation region 211 is formed by implanting $N_2$. In certain embodiment, the passivation region 211 is formed by subjecting photovoltaic region 210 to $O_2$ at about 900 degrees Celsius for approximately thirty minutes.

The ARC 207 is provided to cover essentially the entire solar cell 200. Among other things, the ARC 207 improves the efficiency of the solar cell 200. Typically, during a process of converting solar energy into electricity, the photons received by a solar cell may be reflected, absorbed, or passed through. Only the photons that are absorbed by the photovoltaic material within the solar cell is converted into electricity. Therefore, by reducing the amount of photons reflected and/or deflected, the number of photons absorbed increases, thereby improves the efficiency of the conversion process. Typically, the ARC 207 consists essentially of dielectric material. In various embodiments, the thickness of ARC is less than 0.5 microns. Depending on the material used, the thickness of the ARC 207 varies. The ARC 207 may be formed in various ways. In an embodiment, the ARC 207 is formed by depositing nitride material onto the solar cell 200. For example, a PECVD process is employed for the deposition.

The metal contacts 206, 208, and 209 are used to provide electrical connection. As shown in FIG. 2, the metal contacts 206 and 208 provide electrical connection to the contact region 205. The metal contact 209 provides electrical connection to the emitter region 210. As described above, the polarity between the contact region and the emitter region are opposite. According to a specific embodiment of the present invention, the metal contacts are formed using a sputtering process with Aluminum material. It is to be understood that the metal contacts may be formed using other types of materials and processes as well. For example, aluminum material is altered into a gas phase using ion ejection, which is then in term deposited on the contact region and the emitter region to form contact metal. In a specific embodiment, the metal contact 209 provides a contact to an n+ emitter while the metal contacts 208 and 206 provide contacts to the p+ contact region. It is to be appreciated that the metal contacts are all positioned on the top side of the solar cell 200, thereby allow convention electrical connections.

It is to be understood the solar cell 200 as described above is an exemplary embodiment. There may be other modification and/or alternation as contemplated within the scope of the present invention.

Figure 3:
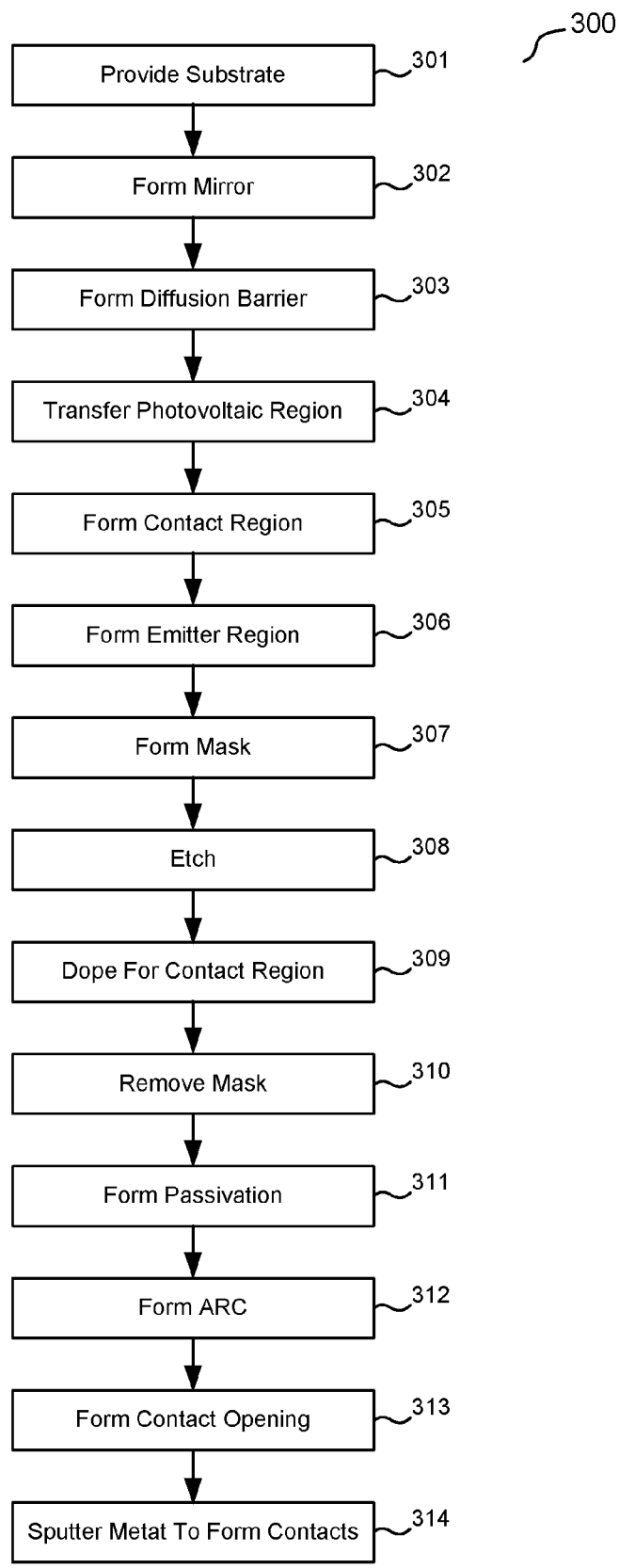
FIG. 3 is simplified flow diagram illustrating a method for manufacturing a solar cell according to an embodiment of the present invention.

FIG. 3 is simplified flow diagram illustrating a method for manufacturing a solar cell according to an embodiment of the present invention. This diagram is merely an example, which should not unduly limit the scope of the claims. One of ordinary skill in the art would recognize many variations, alternatives, and modifications. For example, various steps may be added, removed, replaced, rearranged, repeated, overlapped, and/or partially overlapped.

At step 301, a substrate is provided. The substrate includes a supporting layer. According to various embodiments, the supporting layer is implemented to enhance the rigidity and integrity of the solar cell that is to be manufactured. Considering that the thickness of photovoltaic region in the embodiments of the present invention is often less than twenty microns, the supporting layer is often necessary to allow the solar cell be useful in various applications. For example, without the supporting layer, the solar cell may be easily shattered. In a specific embodiment, the supporting layer consists essentially of metallurgical grade polysilicon material. However, it is to be understood that the supporting layer may include other types of materials as well. According to an embodiment, the supporting layer include material such as permeable and/or porous material. For example, the porous material is capable of withstanding a high temperature. According to other embodiments, the supporting layer include silicon material, metallic material, ceramic material, and/or combinations thereof. In an exemplary embodiment, the thickness of the supporting layer ranges from 150 to 500 microns. Depending on the specific application, the thickness of the supporting layer may be changed. For example, for extra rigidity and reliability, the thickness of the supporting layer may be much greater. As another example, to reduce the bulk and weight of the solar cell, the thickness of the supporting layer may be reduced to, for example, approximately 150 microns. As merely an example, the supporting layer is the supporting layer 201 as shown in FIG. 2.

At step 302, a mirror is formed and overlays the supporting layer. Depending on the application, the mirror may be placed in other positions as well. According to various embodiments, the mirror is placed beneath the photovoltaic region of the solar cell to enhanced efficiency for the solar cell. Among other things, the mirror prevents photon from passing through the photovoltaic region and pass to the supporting layer. With the mirror, the photons that passes through the photovoltaic region is reflected back to the photovoltaic region to allow the energy that is carried by the photon to be captured by the solar cell. According to an embodiment, the mirror consists of refractory and noble metal material and silicide. For example, the metal is silver, silver alloys, titanium nitride, etc. In a specific embodiment, mirror is formed via a deposition process with a thickness of 0.1 to 2 microns. The mirror may be formed by using other processes as well. In a specific embodiment, the thickness of the mirror is approximately 0.2 micron.

At step 303, a diffusion barrier is formed. For example, the diffusion barrier the diffusion barrier 202 as shown in FIG. 2. Depending on the specific process and equipment used for manufacturing the solar cell, the diffusion barrier may be formed in various ways. Among other things, the diffusion barrier layer is used to prevent undesired diffusion of undesirable contaminants and/or impurities from the substrate to migrate to the photovoltaic region. In a specific embodiment, the diffusion barrier layer consists essentially of silicon nitride material. Alternatively, the diffusion barrier layer can include silicon nitride material or combinations of other materials and also be substituted with still other materials, such as titanium nitride, etc. Of course, there can be other variations, modifications, and alternatives. As an example, the silicon nitride material is deposited over the supporting layer using a chemical deposition process, such as a plasma-enhanced chemical vapor deposition (PECVD) process. In various embodiments, the diffusion barrier material is deposited using various types of chemical deposition process. According to a specific embodiment, the diffusion barrier layer is formed by a sputtering process. In an exemplary embodiment, the thickness of the diffusion barrier layer is approximately 0.5 to 3 microns. Within the spirit of the present invention, the thickness of the diffusion barrier layer may be thicker or thinner. In a specific embodiment, the silicon nitride material provides a barrier between the support layer and one or more photovoltaic regions.

At step 304, a photovoltaic material is transferred to the supporting layer. According to certain embodiments, the photovoltaic material is coupled to the supporting layer by an adhesive layer. As explained in the related application, the photovoltaic material, among other things, is characterized by a thickness of less than 20 microns. Merely by way of an example, the thin photovoltaic material may be formed by way of a layer transfer process. According to an embodiment, the photovoltaic material consists essentially of single crystal silicon. In a specific embodiment, the photovoltaic material is slightly doped with boron. There might be other types of doping as well depending on the application. The adhesive layer is provided for coupling the photovoltaic region and the supporting layer together. In a specific embodiment, the adhesive layer is first coupled to the supporting layer and then coupled to the photovoltaic region. In another embodiment, the adhesive layer is first coupled to the photovoltaic region first and then coupled to the supporting layer. For example, the adhesive layer can be sprayed, pasted, or spun on to the supporting layer and/or the photovoltaic material. Typically, a curing process is used. During a curing process, a spin-on-glass material contains a thinning agent material, and the thinning agent is removed (e.g., through an evaporation process), and a solid residue is left on the supporting layer and/or the photovoltaic region.

According to certain embodiments, the adhesive layer consists of spin-on-glass. Other binding materials (e.g. aluminum phosphate) can also be used as the adhesive layer. During the coupling process, the adhesive layer is heated to a high temperature in order for coupling to take place. Typically, the adhesive layer is characterized by a thickness of approximately 0.2 to 5 microns. In certain application, a thicker adhesive layer 204 may be used to provide addition support and coupling strength.

In a specific embodiment, a spin-on-glass (SOG) material is heated to a high temperature and becomes coupled to the supporting layer to form the transferring layer. For example, the SOG material includes organic SOG, inorganic SOG, etc. The transferring layer is then coupled to a thickness of a photovoltaic material. The thickness of the photovoltaic material is defined by a layer transfer or a hydrogenation process. The hydrogen process is described in the U.S. Patent Application No. 60/825,262, filed Sep. 11, 2006, which is incorporated by reference herein.

Once the adhesive layer and the photovoltaic material is coupled to each other, photovoltaic material is then partially removed, leaving the thickness of the photovoltaic material coupled to the adhesive layer, thus forming a photovoltaic region of the solar cell. According to various embodiments, the thickness ranges from 1 to 20 microns. In a specific embodiment, the thickness is approximately 2 microns.

At step 305, a contact region is formed within a thickness of the photovoltaic region. For example, the contact region consists essentially of single crystal silicon material doped with certain types of impurities. In a specific embodiment, the contact region is formed by doping a thickness of the photovoltaic region with various types of impurities characterized by a specific type of polarity. According various embodiments, the contact region is formed before the photovoltaic region is transferred to the supporting layer. For example, the contact region is formed before the photovoltaic region is defined by the hydrogenation process. For example, the contact region is doped with p+ type impurity. In a specific embodiment, the contact region is formed by diffusing boron into the photovoltaic region. For example, double boron implantation process is used to dope the contact region. In a preferred embodiment, the contact region has a thickness of 0.1 to 0.5 micron. In certain applications, the contact region may have a greater thickness for better electrical contact performance. In various application, the contact region is used to provide conductivity and/or to reduce diffusion of certain contaminants from the substrate material.

Figure 4:
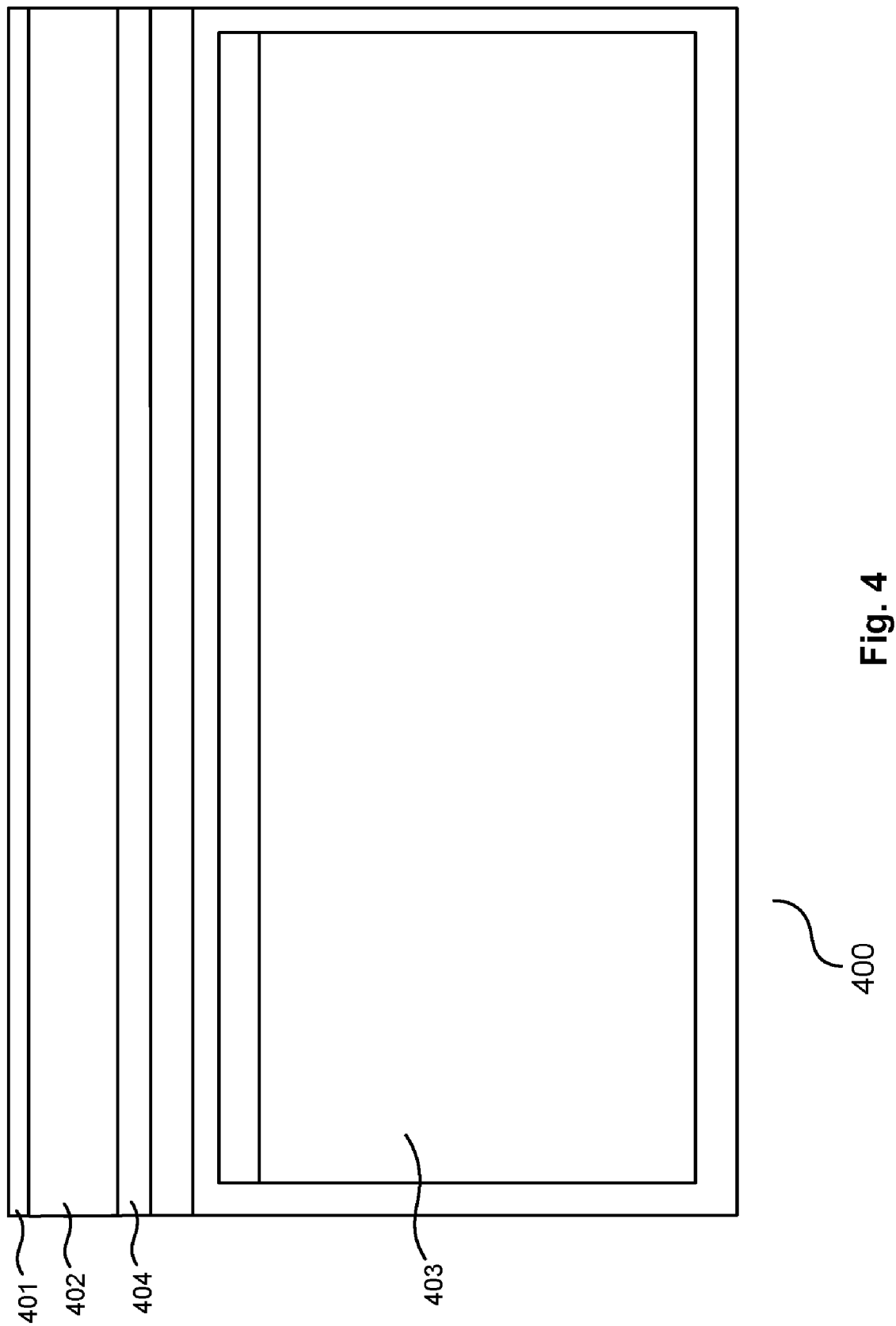
FIG. 4 is a simplified diagram illustrating the formation of an emitter region according to an embodiment of the present invention.

At step 306, an emitter region is formed. FIG. 4 is a simplified diagram illustrating the formation of an emitter region according to an embodiment of the present invention. This diagram is merely an example, which should not unduly limit the scope of the claims. One of ordinary skill in the art would recognize many variations, alternatives, and modifications. As shown in FIG. 4, a partially processed substrate includes, among other things, a supporting layer 403 and a photovoltaic region 402. An emitter region 401 is formed within a thickness of the photovoltaic region 402. A contact region 404 is positioned at the opposite side of the photovoltaic region 402. The emitter region 401 is characterized by a polarity that is opposite from the polarity of the contact region 404. In a specific embodiment, the emitter region 401 is characterized by an n+ polarity (e.g., the emitter region becomes n+ type by containing arsenic, phosphorous, and/or other types of material) wherein the contact region 404 is characterized by a p+ polarity. Depending on the application, various processes may be used for forming the n+ polarity. These processes include diffusion, implantation, etc. For example, the emitter region 401 is formed by diffusion n+ material into a thickness of the photovoltaic region 402. For example, the emitter region 401 is formed by a diffusion process where the photovoltaic region 402 is subjected to POCl₃ at 900 degrees Celsius for 30 minutes. In various embodiments, it is preferred for the emitter region to be shallow, thereby allowing the majority of photovoltaic material to be used for obtaining energy from the light. In an alternative embodiment, the emitter region 401 is characterized by a p+ polarity wherein the contact region 404 is characterized by an n+ polarity. For example, the emitter region 401 is formed by diffusion p+ material (e.g., p+ material includes boron, etc.) into a thickness of the photovoltaic region 402. Typically, the thickness of the emitter region 401 is approximately 0.1 to 0.5 micron, which is similar to the thickness of the contact region 404. In certain applications, the emitter region 401 may have a greater thickness for better electrical contact performance.

At step 307, a mask is formed and overlays the emitter region. According to certain embodiments, the mask is formed by first depositing photoresist material over the photovoltaic region and the defining patterns on the photoresist material by way of a lithography process. According to various embodiments, the pattern exposes a region for forming a contact with the contact region. The mask, among other thing, defines one or more contact regions. For example, the contact regions are provided to form contact openings. Depending on the application and the photoresist material used, the thickness of the mask varies, typically less than 50 microns.

Figure 5:
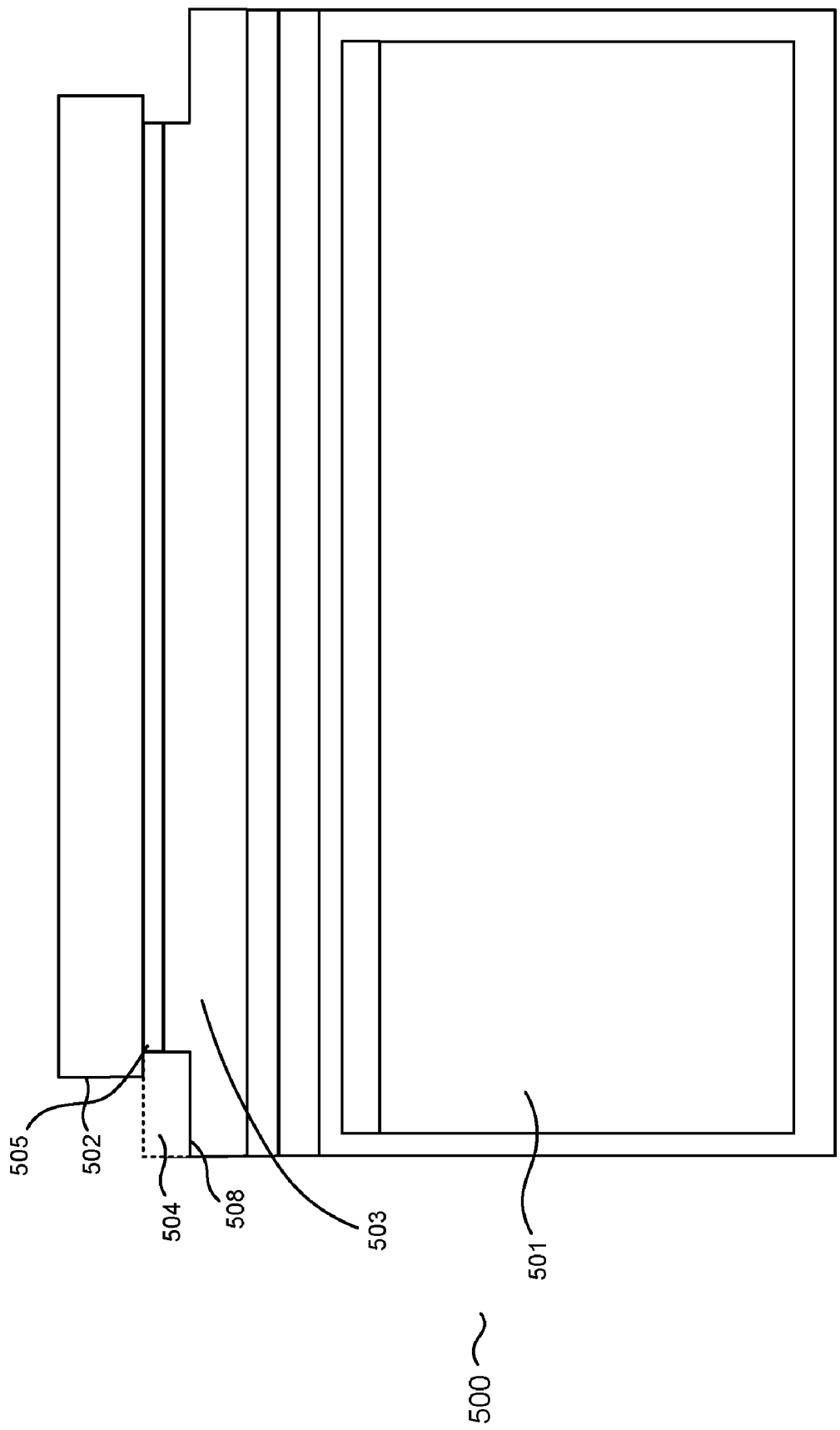
FIG. 5 is a simplified diagram illustrating an etching process for forming contact openings according to an embodiment of the present invention.

At step 308, an etching process is performed. FIG. 5 is a simplified diagram illustrating an etching process for forming contact openings according to an embodiment of the present invention. This diagram is merely an example, which should not unduly limit the scope of the claims. One of ordinary skill in the art would recognize many variations, alternatives, and modifications. As shown in FIG. 5, after an etching process is performed, openings (e.g., opening 504, etc.) are formed. According to a specific embodiment, the openings are formed by using isotropic etching process. Depending on the application, etching may be performed using liquid and/or gas. As can be seen in FIG. 5, the isotropic etching process slightly undercuts the photovoltaic region, thereby creating a recess region 505 beneath the mask. For example, the recess 505 has a width of approximately 0.5 micron. According to certain embodiment, the etching process is not performed, as photoresist material exposes the openings at the time of the deposition.

At step 309, the exposed opening of the photovoltaic region is doped. In certain embodiments, impurities with same polarity as the contact region polarity is doped to region 504 of the photovoltaic region, thereby allow an electrical contact to be formed with the contact region. For example, both the contact region and the region 504 are characterized by p+ type impurity. The recess 505 formed in step 308 provides a gap between newly doped contact region and the emitter region, thereby eliminates and/or reduces the possibility of shorting the contact region and the emitter region.

According a specific embodiment, the doping process in step 309 is performed by deposit an aluminum material over the photoresist and the exposed opening. The aluminum material is then subjected to a high temperature (e.g., approximately 700 to 900 degrees Celsius). As a result of the high temperature, the aluminum material is diffused into the exposed openings of the photovoltaic region, forming a contact with the contact region. For example, the concentration of the aluminum material diffused into the exposed opening is at least $10^{16}$. In addition to aluminum, other types of material may be used, such as aluminum compounds (e.g., aluminum silver compound, etc.)

At step 310, the mask is removed. Depending on the application, the mask may be removed in various ways, such as physical polishing, chemical removal, dissolving, etc.

Figure 6:
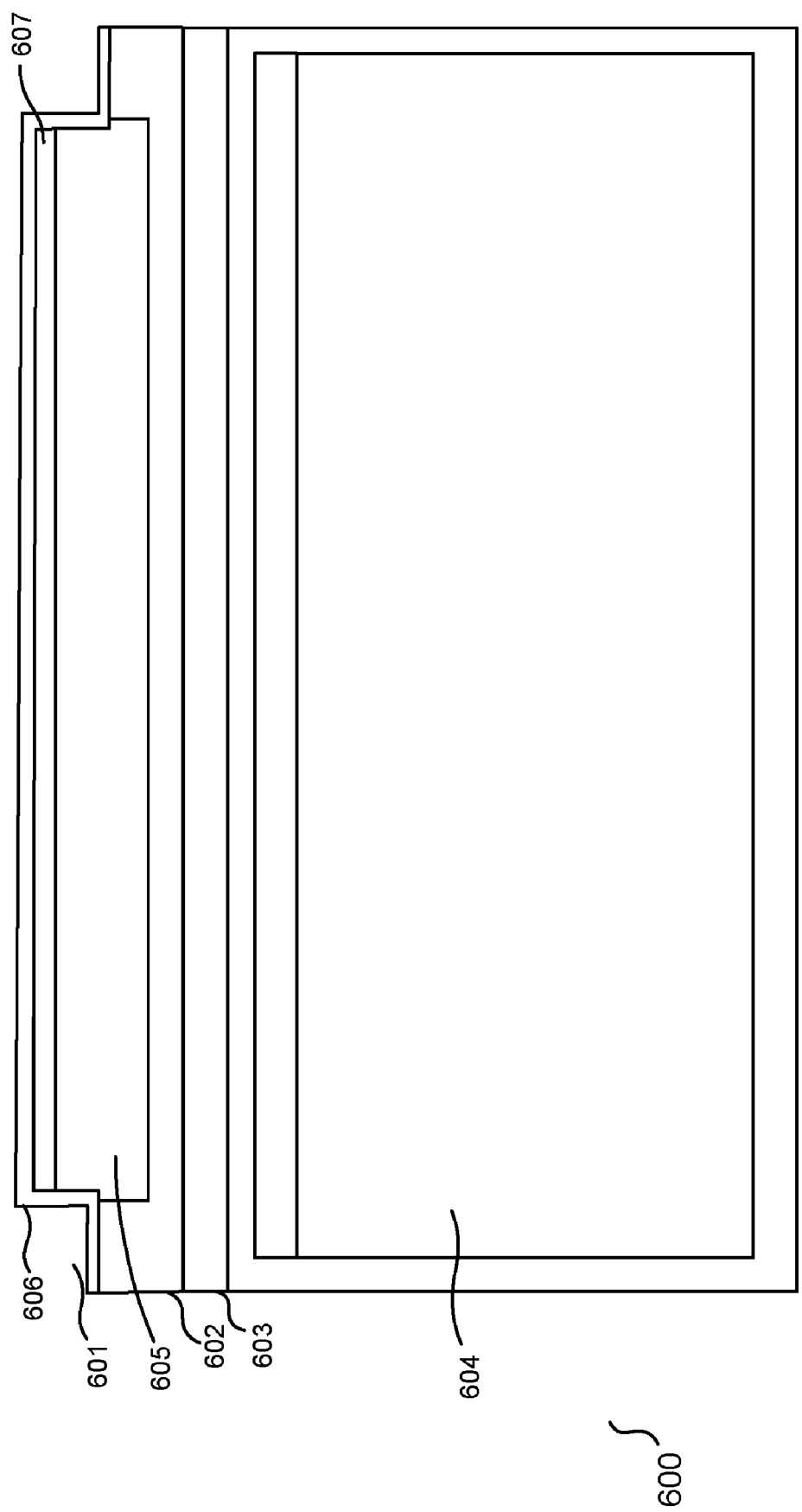
FIG. 6 is simplified diagram illustrating forming a passivation region according to an embodiment of the present invention.

At step 311, a thin passivation region is formed, overlaying the photovoltaic region. FIG. 6 is simplified diagram illustrating forming a passivation region according to an embodiment of the present invention. This diagram is merely an example, which should not unduly limit the scope of the claims. One of ordinary skill in the art would recognize many variations, alternatives, and modifications. The passivation region 606 overlays both the emitter region 607 and the exposed portion of the contact region 605. Depending on the application, the passivation region 606 may include oxide, nitride, and/or other types of materials. In certain applications, the passivation region 606 to improve perform by reducing and/or eliminating recombination of carriers. In addition, the passivation region 606 improves device reliability for certain applications. For example, the thickness of the passivation region 606 is approximately between 50 to 100 angstroms. In a specific embodiment, the passivation region 606 is formed by way of implanting active $O_2$. In an alternative embodiment, the passivation region 606 is formed by implanting $N_2$. In certain embodiments, the passivation region 606 is formed by subjecting photovoltaic region 210 to $O_2$ at about 800 to 900 degrees Celsius for approximately thirty minutes. Depending on the application and the desired thickness of the passivation layer, paramaters for forming the passivation layer vary. Among other things, the passivation region provides insulation to separate the contact region and the emitter region, thereby eliminates and/or reduces the possibility of shorting the contact region and the emitter region. Passivation region thus enhances and reliability and performance of the solar cell. In certain embodiments, the step 311 for forming the passivation region is skipped.

Figure 7:
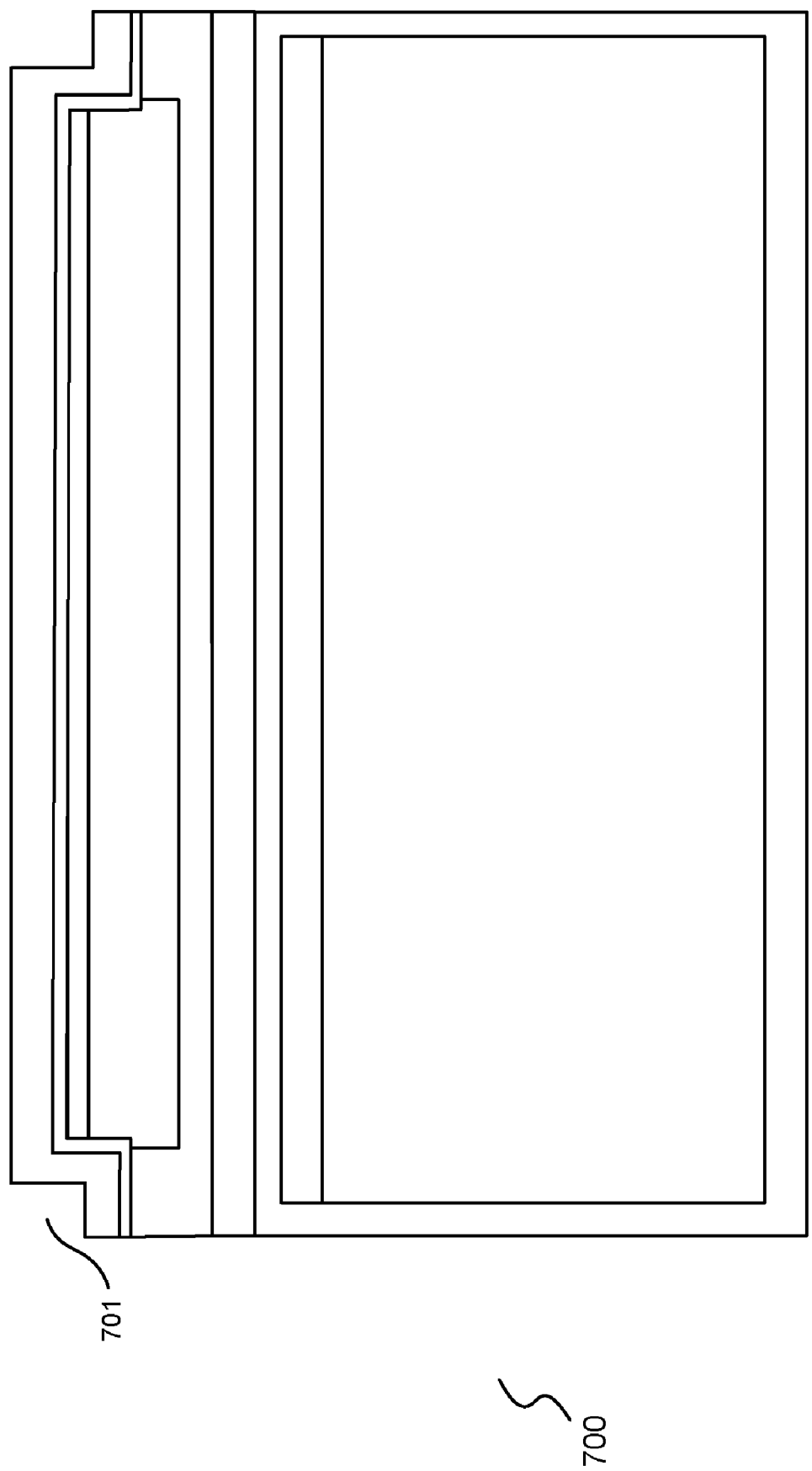
FIG. 7 is a simplified diagram illustrating forming an anti-reflection coating according to an embodiment of the present invention.

At step 312, an anti-reflection coating overlaying the passivation is formed. FIG. 7 is a simplified diagram illustrating forming an anti-reflection coating according to an embodiment of the present invention. This diagram is merely an example, which should not unduly limit the scope of the claims. One of ordinary skill in the art would recognize many variations, alternatives, and modifications. The ARC 701 may be formed in various ways. In an embodiment, the ARC 701 is formed by depositing nitride material onto the solar cell 700. For example, a PECVD process is employed for the deposition. For example, the PECVD process allows the deposition of ARC 701 to be performed at a low temperature, thereby reducing the valuable thermal budget for this step. According to certain embodiments, the ARC 701 is provided to cover essentially the top side of the solar cell 700. Among other things, the ARC 701 improves the efficiency of the solar cell 700. The ARC 701 may include silicon nitride material, silicon oxide material, transparent material, and other types of material. Typically, during a process of converting solar energy into electricity, the photons received by a solar cell may be reflected, absorbed, or passed through. Only the photons that are absorbed by the photovoltaic material within the solar cell are converted into electricity. Therefore, by reducing the amount of photons reflected and/or deflected, the number of photons absorbed increases, thereby improves the efficiency of the conversion process. Typically, the ARC 701 consists essentially of dielectric material. In a specific embodiment, the ARC is provided to optimize the ability to trap green light. Depending on the material used and desired solar spectrum, the thickness of the ARC 207 varies. For example, the thickness of ARC is based on both the green light spectrum and the reflection index of the ARC material.

Figure 8:
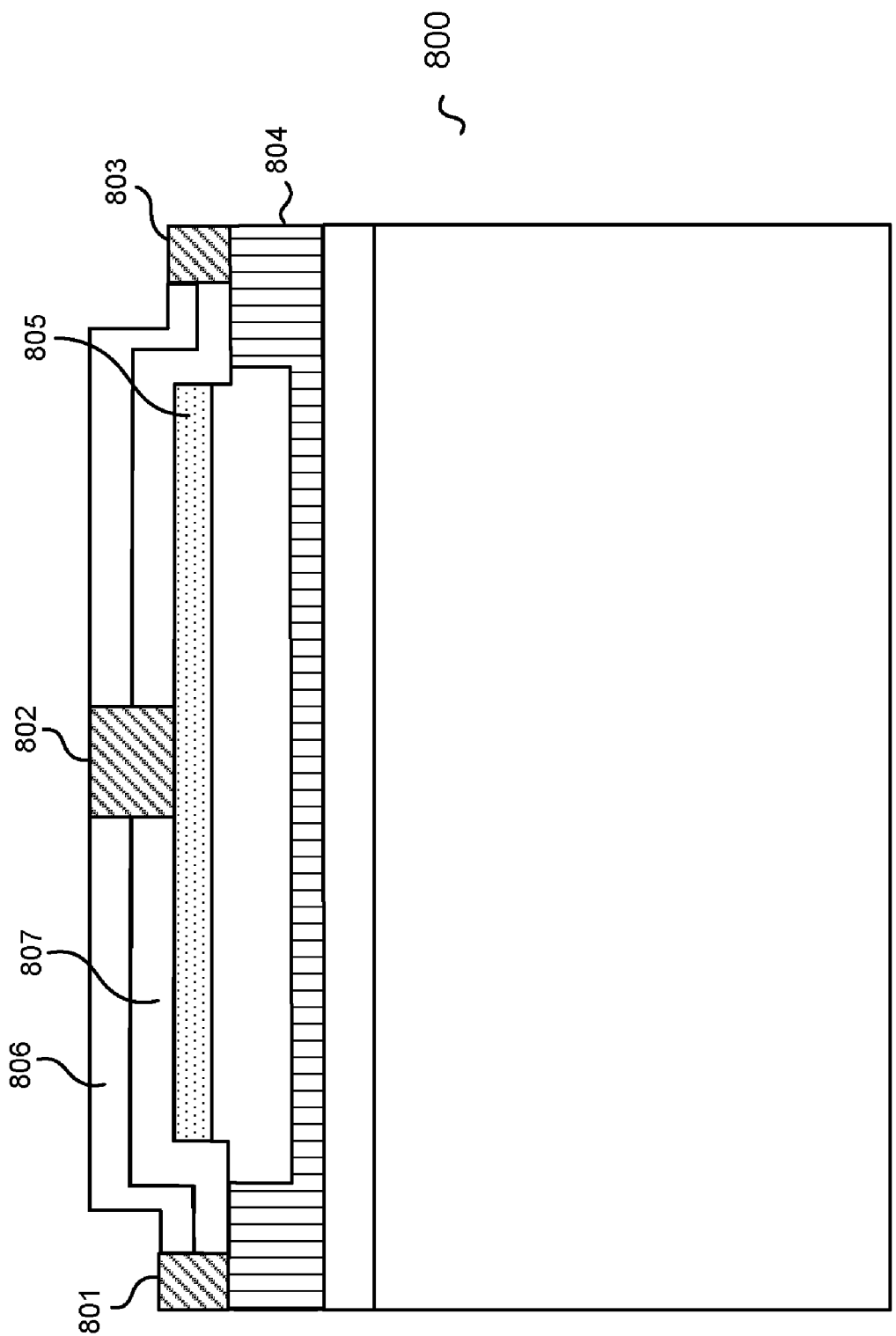
FIG. 8 is a simplified diagram illustrating the process for forming contact openings according to an embodiments of the present invention.

At step 313, an contact opening are formed. Depending on the application, various types of processes may be used to form the contact opening. FIG. 8 is a simplified diagram illustrating the process for forming contact openings according to an embodiment of the present invention. This diagram is merely an example, which should not unduly limit the scope of the claims. One of ordinary skill in the art would recognize many variations, alternatives, and modifications. As shown in FIG. 8, openings 801, 802, and 803 are formed by using an etching process. The openings 801 and 803 are formed to provide contact to the contact region 804. It is to be noted that the opening 801 and 803 are insulated from the emitter region 805 by the ARC 806 and the passivation 807. The opening 802 is formed to provided electrical contact to the emitter region 805. As shown, the opening 802 is insulated from the contact region 804. Depending on the application, the shape and/or size of the openings may vary.

At step 314, a sputtering process is used to form metal contacts for the solar cell. Now referring back to FIG. 2, the metal contacts 206, 208, and 209 are used to provide electrical connection. For example, metal materials such as aluminum, silver, nickel, etc., can be sputtered for forming contacts. The metal contacts 206 and 208 provide electrical connection to the contact region 205. The metal contact 209 provides electrical connection to the emitter region 210. As described above, the polarity between the contact region and the emitter region are opposite. According to a specific embodiment of the present invention, the metal contacts are formed using a sputtering process with Aluminum material. It is to be understood that the metal contacts may be formed using other types of materials and processes as well. For example, aluminum material is altered into a gas phase using ion ejection, which is then in term deposited on the contact region and the emitter region to form contact metal. In a specific embodiment, the metal contact 209 provides a contact to an n+ emitter while the metal contacts 208 and 206 provide contacts to the p+ contact region. It is to be appreciated that the metal contacts are all positioned on the top side of the solar cell 200, thereby allow convention electrical connections.

According to certain embodiments, steps 313 and 314 are replaced by a different process. A silver paste (e.g., a liquid includes silver and epoxy) material is deposited over the regions for the openings 801, 802, and 803. The deposited silver paste is then subjected to a high temperature at approximately 400 to 800 degrees Celsius. The high temperature causes the silver paste to penetrate the ARC and passivation layers, thereby forming metal contacts (e.g., containing essentially silver metal material) with the emitter region and the contact region.

As explained above, various steps as illustrated in FIG. 3 may be added, removed, replaced, rearranged, repeated, overlapped, and/or partially overlapped and should not unduly limited the scope of the present invention.

According to an embodiment, the present invention provides a method for manufacturing a solar cell. The method includes providing a substrate. For example, the substrate includes a support region. The method also includes transferring a photovoltaic material overlying the support region of the substrate. The photovoltaic material is characterized by a first thickness. The method further includes forming an emitter region on the photovoltaic material by a at least diffusion process. The emitter region is characterized by a first impurity type. In addition, the method includes forming a mask overlaying the emitter region. The mask exposes at least a first contact region. The method also includes forming the first contact region within the first thickness of the photovoltaic material. Furthermore, the method includes doping the first contact region with a second impurity type. The second impurity type and the first impurity type are characterized by opposite polarities. Moreover, the method includes removing the mask. The method additionally includes forming a passivation overlaying the first contact region and the photovoltaic. Also, the method includes forming an anti-reflection coating overlaying the passivation. The method further includes forming a pattern using the anti-reflection region for a first opening and a second opening. The first opening is positioned within a vicinity of the first contact region and exposes the first contact region. The second opening is positioned outside the first contact region and exposing the emitter region. The first opening and the second opening face a substantially similar direction. Furthermore, the method includes sputtering metal material to form a first metal contact and a second metal. The first metal contact is electrically coupled to the first contact region. The second metal contact is electrically coupled to the emitter region. For example, the method is illustrated according to FIG. 3.

According to yet another embodiment, the present invention provides a partially processed semiconductor substrate for manufacturing a solar cell. The substrate includes a support layer. The support layer is characterized by a thickness of at least 150 microns. The substrate also includes an adhesive layer overlaying the support layer. The substrate further includes a photovoltaic material overlaying the transferring layer. The photovoltaic material is characterized by a thickness of less than fifteen microns. The photovoltaic material includes a top region and a bottom region. The top region is characterized by a first impurity type. The bottom side is characterized by a second impurity type. The first impurity type and the second impurity type have opposite polarities. The photovoltaic material includes a first opening, which exposes the bottom region. The substrate further includes a passivation overlaying the photovoltaic material. The passivation includes a second opening exposing the top region. The substrate additionally includes an anti-reflection region overlaying the passivation. The anti-reflection region includes a third opening exposing the top region. The substrate further include a first metal contact that has a first portion and a second portion. The first portion is electrically coupled to the bottom region. The second portion partially overlays the anti-reflection region. Moreover, the substrate includes a second metal contact including a third portion and a fourth portion. The third portion is electrically coupled to the top region. The fourth portion partially overlays the anti-reflection region. For example, the substrate illustrated according to FIG. 2.

According to yet another embodiment, the present invention provides a method for manufacturing a solar cell. The method includes providing a partially processed semiconductor substrate. The substrate includes at least a support layer and a photovoltaic material. The support layer is characterized by a thickness of at least 150 microns. The photovoltaic material overlays the support layer. The photovoltaic material is characterized by a thickness of less than fifteen microns. The photovoltaic material includes a top region and a bottom region. The top region is characterized by a first polarity. The bottom side is characterized by a second polarity. The first polarity is opposite from the second polarity. The method also includes forming a mask overlaying the top side. The mask exposes at least a first contact region. The method also includes forming a first contact opening partially exposing the bottom side. Furthermore, the method includes removing the mask. In addition, the method includes forming a passivation overlaying the top region. The method further includes forming an anti-reflection coating overlaying the passivation. Moreover, the method includes defining a pattern using the anti-reflection region for the first opening and a second opening. The second opening is positioned outside the first contact region and exposing the a portion of the top region. The method additionally includes sputtering metal material to form a first metal contact and a second metal contact using a sputtering process. The first metal contact is electrically coupled to the top region. The second metal contact is electrically coupled to the bottom region. The first metal contact and the second metal contact are positioned on a same side. For example, the method is illustrated according to FIG. 3.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for manufacturing a solar cell, the method comprising:
    providing a support substrate, the support substrate including a support region;
    providing a photovoltaic material having a surface portion to be transferred to the support region of the support substrate;
    bonding the photovoltaic material surface portion to the support region of the support substrate;
    exfoliating and transferring the photovoltaic material surface portion to the support region of the support substrate, the transferred photovoltaic material having a first thickness including a conducting layer positioned within the first thickness, the first thickness being less than 20 microns;
    forming an emitter region on the photovoltaic material by at least a diffusion process, the emitter region being characterized by a first impurity type;
    forming a mask overlaying the emitter region, the mask exposing at least a first contact region;
    forming the first contact region on the transferred photovoltaic material by doping the first contact region with a second impurity type, the second impurity type and the first impurity type being characterized by opposite polarities, the first contact region being electrically coupled to the conducting layer;
    removing the mask;
    forming a passivation overlaying the first contact region and the transferred photovoltaic material;
    forming an anti-reflection coating overlaying the passivation;
    forming a pattern using the anti-reflection region for a first opening and a second opening, the first opening being positioned within a vicinity of the first contact region and exposing the first contact region, the second opening being positioned outside the first contact region and exposing the emitter region, the first opening and the second opening facing a substantially similar direction; and
    sputtering metal material to form a first metal contact and a second metal contact, the first metal contact being electrically coupled to the first contact region, the second metal contact being electrically coupled to the emitter region.

2. The method of claim 1 wherein the forming a pattern comprises stripping one or more portion of the anti-reflection region.

3. The method of claim 1 wherein the metal material comprises aluminum material.

4. The method of claim 1 wherein the forming the emitter region comprises diffusing n+ emitter.

5. The method of claim 1 wherein the emitter region is characterized by a thickness of less than 0.2 micron.

6. The method of claim 1 wherein the mask comprises a photoresist material.

7. The method of claim 1 wherein the forming the first contact region comprises an isotropic etching process.

8. The method of claim 1 wherein the forming the first contact region comprises forming a recess region underneath the mask.

9. The method of claim 1 wherein the passivation comprises a nitride material.

10. The method of claim 1 wherein the passivation comprises an oxide material.

11. The method of claim 1 further comprising doping the first contact region with a p+ polarity.

12. The method of claim 1 further comprising doping the first contact region with a double boron implantation.

13. The method of claim 1 further comprising doping the first contact region with a double boron implantation at a depth of approximately 0.1 micron.

14. The method of claim 1 further comprising doping the first contact region with a double boron implantation at a depth of approximately 0.2 micron.

15. The method of claim 1 wherein the forming a passivation comprises activating an oxide material.

16. The method of claim 1 wherein the forming a passivation comprises implanting an oxide material.

17. The method of claim 1 wherein the forming an anti-reflection coating comprises depositing a dielectric material.

18. The method of claim 1 wherein the forming an anti-reflection coating comprises performing PECVD process for depositing nitride material.

19. The method of claim 1 wherein the first metal comprises an AlSi material.

20. The method of claim 1 wherein the first metal comprises a silver alloy material.

21. The method of claim 1 wherein the forming an emitter region comprises subjecting the photovoltaic material to $POCl_3$.

22. The method of claim 1 wherein the transferred photovoltaic material is characterized by a thickness of less than fifteen microns.

23. The method of claim 1 wherein the support substrate is characterized by a thickness of approximately 250 microns.

24. The method of claim 1 further comprising forming a glue layer bonding the support substrate support region and the surface portion of the photovoltaic material prior to the transfer of the surface portion of the photovoltaic material, the glue layer comprising a spin-on-glass.

25. The method of claim 1 further comprising forming a glue layer bonding the support substrate support region and the surface portion of the photovoltaic material prior to the transfer of the surface portion of the photovoltaic material, the glue layer comprising a mixture of adhesive components.

26. The method of claim 24 wherein the glue layer is characterized by a thickness of between one to three microns.

27. The method of claim 1 further comprising forming a mirror by depositing metal materials over the support substrate.

28. The method of claim 1 further comprising forming a mirror by depositing dielectric stacks over the support substrate.

29. The method of claim 1 wherein the support substrate further comprises a mirror overlaying the support region, the mirror comprising metal material.

30. The method of claim 1 wherein the substrate further comprises a mirror overlaying the support region, the mirror comprising dielectric stack material.

31. The method of claim 1 wherein the support substrate comprises a metallurgical grade polysilicon material.

32. The method of claim 1 wherein the support substrate comprises a ceramic material or refractory material.

33. A method for manufacturing a solar cell, the method comprising:
provide a partially processed semiconductor substrate, the substrate including at least a support layer and a layer of transferred photovoltaic material, the layer of transferred photovoltaic material having been bonded to the support layer of the substrate and subsequently exfoliated from a surface portion of a photovoltaic material, the support layer being characterized by a thickness of at least 150 microns, the transferred photovoltaic material overlaying the support layer, the transferred photovoltaic material being characterized by a thickness of less than twenty microns, the transferred photovoltaic material including a top region and a bottom region, the top region being characterized by a first polarity, the bottom region being characterized by a second polarity, the first polarity being opposite from the second polarity;
forming a mask overlaying the top region, the mask exposing at least a first contact region;
forming a first contact opening partially exposing the bottom region;
removing the mask;
forming a passivation overlaying the top region;
forming an anti-reflection coating overlaying the passivation;
defining a pattern using the anti-reflection region for the first opening and a second opening, the second opening being positioned outside the first contact region and exposing the a portion of the top region; and
sputtering metal material to form a first metal contact and a second metal contact using a sputtering process, the first metal contact being electrically coupled to the top region, the second metal contact being electrically coupled to the bottom region, the first metal contact and the second metal contact being positioned on a same side.

34. The method of claim 33 further comprising forming a glue layer positioned between the support layer and the transferred photovoltaic material to bond the transferred photovoltaic material to the support layer.

35. The method of claim 33 wherein the first metal contact comprises an AlSi material.

36. A method for manufacturing a solar cell, the method comprising:
providing a support substrate, the support substrate including a support region;
providing a photovoltaic material having a surface portion to be transferred to the support region of the support substrate;
bonding the photovoltaic material surface portion to the support region of the support substrate;
exfoliating and transferring the photovoltaic material surface portion to the support region of the support substrate, the transferred photovoltaic material being characterized by a first thickness, the transferred photovoltaic material including a conducting layer positioned within the first thickness;
forming an emitter region on the transferred photovoltaic material by at least a diffusion process, the emitter region being characterized by a first impurity type;
forming a mask overlaying the emitter region, the mask exposing at least a first contact region;
forming the first contact region within the first thickness of the transferred photovoltaic material by doping the first contact region with a second impurity type, the second impurity type and the first impurity type being characterized by opposite polarities;

removing the mask;
forming a passivation overlaying the first contact region and the transferred photovoltaic material;
forming an anti-reflection coating overlaying the passivation;
defining a plurality of contact positions, the plurality of contact positions including a first contact position and a second contact position;
depositing a silver paste material over the plurality of contact positions;
subjecting the silver paste material to a first condition; and
forming a first contact and a second contact using the silver paste material, the first contact being electrically coupled to the contact region, the second contact being electrically coupled to the emitter region.

37. The method of claim 25 wherein the glue comprises aluminum phosphate.

* * * * *